(12) United States Patent
Onuki

(10) Patent No.: US 12,538,593 B2
(45) Date of Patent: Jan. 27, 2026

(54) PHOTOELECTRIC CONVERSION APPARATUS, PHOTOELECTRIC CONVERSION SYSTEM, AND MOVABLE OBJECT

(71) Applicant: CANON KABUSHIKI KAISHA, Tokyo (JP)

(72) Inventor: Yusuke Onuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 819 days.

(21) Appl. No.: 17/707,611

(22) Filed: Mar. 29, 2022

(65) Prior Publication Data

US 2022/0320158 A1 Oct. 6, 2022

(30) Foreign Application Priority Data

Mar. 31, 2021 (JP) ................. 2021-059052

(51) Int. Cl.
*B60R 1/22* (2022.01)
*H10F 39/00* (2025.01)
(52) U.S. Cl.
CPC .............. *H10F 39/802* (2025.01); *B60R 1/22* (2022.01)
(58) Field of Classification Search
CPC ........ H01L 27/146; H10F 39/802; B60R 1/22
See application file for complete search history.

(56) References Cited

U.S. PATENT DOCUMENTS

| 2011/0143485 A1 | 6/2011 | Tazoe | |
| 2015/0097219 A1* | 4/2015 | Kato | H10D 86/60 257/292 |
| 2015/0097998 A1* | 4/2015 | Kato | H10F 39/811 348/308 |
| 2016/0133516 A1 | 5/2016 | Ito | |
| 2019/0252443 A1* | 8/2019 | Kobayashi | H04N 25/79 |
| 2021/0043792 A1* | 2/2021 | Iwata | G01S 17/894 |
| 2021/0288098 A1 | 9/2021 | Kurogi | |

(Continued)

FOREIGN PATENT DOCUMENTS

| JP | 2010273095 A | 12/2010 |
| JP | 2011124454 A | 6/2011 |
| JP | 2016092367 A | 5/2016 |

(Continued)

*Primary Examiner* — Marlon T Fletcher
*Assistant Examiner* — Da Wei Lee
(74) *Attorney, Agent, or Firm* — Canon U.S.A., Inc. IP Division

(57) ABSTRACT

A photoelectric conversion apparatus according to an embodiment includes a first chip and a second chip. The first chip includes a first semiconductor element layer having a pixel region having pixel circuits and a peripheral region and a first wiring structure including a first wiring layer. The second chip includes a second semiconductor element layer having an electric circuit and a second wiring structure. The first and second chips are stacked, and have a trench extending through the first semiconductor element layer and having a pad through which a reference potential is supplied to the pixel circuits. The first wiring layer includes a first wiring pattern to which the reference potential is supplied. In plan view, the first wiring pattern located in a region aligned with the pixel region has a higher wiring density than the first wiring pattern located in a region aligned with the peripheral region.

15 Claims, 14 Drawing Sheets

(56) References Cited

U.S. PATENT DOCUMENTS

2021/0399031 A1* 12/2021 Kobayashi ............ H10F 39/811

FOREIGN PATENT DOCUMENTS

| JP | 2019068265 A | 4/2019 |
|---|---|---|
| JP | 2019140253 A | 8/2019 |
| WO | 2018/034092 A1 | 2/2018 |
| WO | 2018186194 A1 | 10/2018 |

* cited by examiner

PHOTOELECTRIC CONVERSION APPARATUS, PHOTOELECTRIC CONVERSION SYSTEM, AND MOVABLE OBJECT

BACKGROUND

Field of the Disclosure

The present disclosure relates to a photoelectric conversion apparatus.

Description of the Related Art

Japanese Patent Laid-Open No. 2019-68265 discloses a photoelectric conversion apparatus including a stack of a chip having multiple pixel circuits and a chip having multiple electric circuits.

In the photoelectric conversion apparatus including the stack of the chip having the pixel circuits and the chip having the electric circuits, the pixel circuits are in electrical connection with the electric circuits. The pixel circuits are supplied with a reference potential from pads. The reference potential is, for example, a ground voltage (GND voltage) or a power supply voltage (VDD voltage).

For wiring patterns to which the reference potential is supplied, Japanese Patent Laid-Open No. 2019-68265 does not describe a concrete layout of the wiring patterns in a pixel region and a peripheral region outside the pixel region.

SUMMARY

A photoelectric conversion apparatus according to an embodiment includes a first chip and a second chip. The first chip includes a first semiconductor element layer and a first wiring structure. The first semiconductor element layer has a pixel region having an array of pixel circuits and a peripheral region located outside the pixel region in plan view. The first wiring structure includes a first wiring layer. The second chip includes a second semiconductor element layer and a second wiring structure. The second semiconductor element layer has an electric circuit. The first chip and the second chip are stacked, and have a trench that extends through the first semiconductor element layer and that has a pad through which a reference potential is supplied to the pixel circuits. The first wiring layer includes a first wiring pattern to which the reference potential is supplied. In plan view, the first wiring pattern located in a region aligned with the pixel region has a higher wiring density than the first wiring pattern located in a region aligned with the peripheral region.

Further features of the present disclosure will become apparent from the following description of exemplary embodiments with reference to the attached drawings.

DESCRIPTION OF THE EMBODIMENTS

Figure 1:
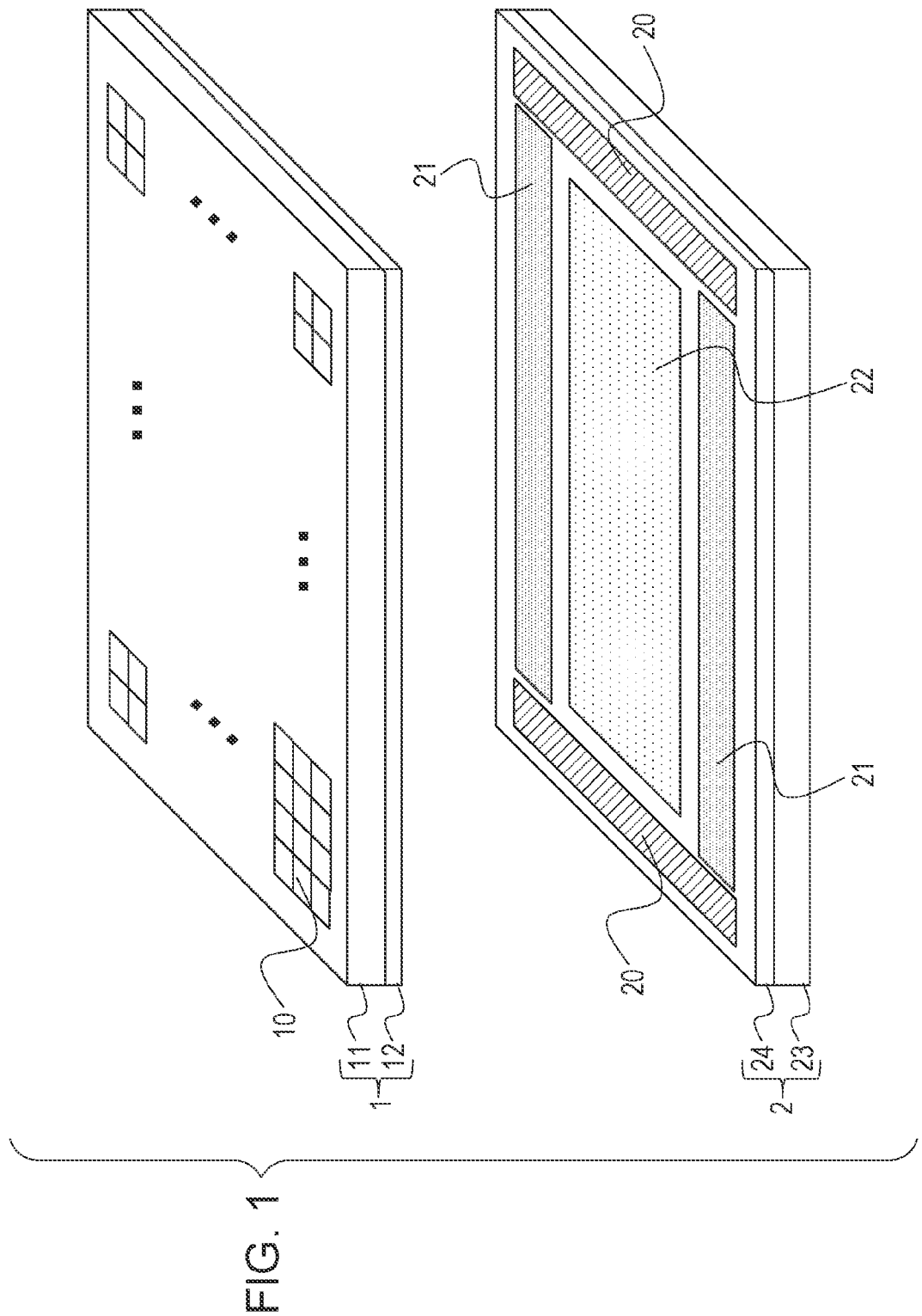
FIG. 1 is a perspective view of a photoelectric conversion apparatus according to a first embodiment illustrating a schematic exemplary configuration of the apparatus.

Exemplary embodiments described herein are intended to embody the technical concept of the present disclosure, and are not intended to limit the scope of the present disclosure. Sizes of components and a positional relationship between the components in the drawings may be exaggerated for purposes of clear illustration. In the following description, the same components are designated by the same reference numerals, and a description thereof may be omitted.

Exemplary embodiments of the present disclosure will be described in detail below with reference to the drawings. In the following description, terms indicating a specific direction or position (e.g., "upper", "lower", "right", "left", and other terms including those terms) are used as necessary. Those terms are used for easy understanding of the embodiments with reference to the drawings, and should not be construed as limiting the technical scope of the present disclosure.

As used herein, the term "plan view" refers to a view as viewed in a direction perpendicular to a light-incident surface of a semiconductor element layer, which will be described later. The term "section" refers to a section taken in the direction perpendicular to the light-incident surface of the semiconductor element layer. In a case where the light-incident surface of the semiconductor element layer is microscopically rough, plan view is defined with reference to the light-incident surface of the semiconductor element layer when viewed macroscopically.

First Embodiment

A photoelectric conversion apparatus according to a first embodiment will be described with reference to FIGS. 1 to 5B. FIG. 1 is a schematic perspective view of the photoelectric conversion apparatus according to this embodiment. The photoelectric conversion apparatus is a semiconductor device that can be used as, for example, an image sensor, a light metering sensor, or a focusing sensor.

The photoelectric conversion apparatus is a stack of a chip 1 and a chip 2. The chip 1 includes a semiconductor element layer 11 (first semiconductor element layer) including pixel circuits included in pixels 10 and a wiring structure 12 (first wiring structure) including M wiring layers. As used herein, the term "semiconductor element layer" refers to a layer including not only a semiconductor layer but also gates of transistors formed in the semiconductor layer. The "semiconductor element layer" does not include a wiring layer of a wiring structure. The chip 2 includes a wiring structure 24 (second wiring structure) including N wiring layers and a semiconductor element layer 23 (second semiconductor element layer) including an electric circuit. The first wiring structure 12 and the second wiring structure 24 are interposed between the semiconductor element layers 11 and 23.

As will be described in detail later, at least a subset of elements constituting each pixel 10 is disposed in the semiconductor element layer 11. A subset of the elements constituting the pixel 10 may be disposed in the semiconductor element layer 11, and another subset of the elements may be disposed in the semiconductor element layer 23. A non-limiting example of a pixel-circuit element of the pixel 10 that is disposed in the semiconductor element layer 11 is a photoelectric conversion element, such as a photodiode. The pixel circuits including the photoelectric conversion elements are arranged in a two-dimensional array in plan view in the semiconductor element layer 11.

The semiconductor element layer 11 has a pixel region having the two-dimensional array of the pixel circuits in plan view. Referring to FIG. 1, the photoelectric conversion elements included in the pixel circuits are arranged in the two-dimensional array, or in a row direction and in a column direction in the semiconductor element layer 11.

The wiring structure 12 includes the M (M is an integer of 1 or more) wiring layers and an interlayer insulating material. The wiring structure 24 includes the N (N is an integer of 1 or more) wiring layers and an interlayer insulating material.

The semiconductor element layer 23 includes the electric circuit. For convenience of description, components arranged in the semiconductor element layer 23 are illustrated as being on an upper surface of the chip 2 in FIG. 1. The electric circuit is, for example, at least one of a plurality of row scanning circuits 20, a plurality of column scanning circuits 21, and a signal processing circuit 22 illustrated in FIG. 1. The signal processing circuit 22 is, for example, at least one of or a combination of a subset of the elements constituting each pixel 10, an amplifier circuit, a selection circuit, a logic operation circuit, an analog-to-digital (AD) conversion circuit, a memory, and a circuit for compression, synthesis, and/or any other processing. A subset of the elements constituting the pixel 10 includes an amplification transistor, a selection transistor, and a reset transistor.

The term "pixel 10" may refer to the smallest unit of circuitry that is repeatedly disposed to form an image.

The pixel circuit included in each pixel 10 and disposed in the semiconductor element layer 11 has to include at least a photoelectric conversion element. The pixel circuit may include an element other than the photoelectric conversion element. For example, the pixel circuit may further include at least one of a transfer transistor, a floating diffusion (FD), a reset transistor, an amplification transistor, a capacitance addition transistor, and a selection transistor. Typically, a selection transistor and a group of elements connected to a signal line via the selection transistor constitute the pixel 10. In other words, the selection transistor may be an outer edge of the pixel circuit. A combination of a photoelectric conversion element and a transfer transistor may constitute the pixel 10. A combination of one amplifier circuit or one AD conversion circuit and one or more photoelectric conversion elements may constitute the pixel 10.

Figure 2:
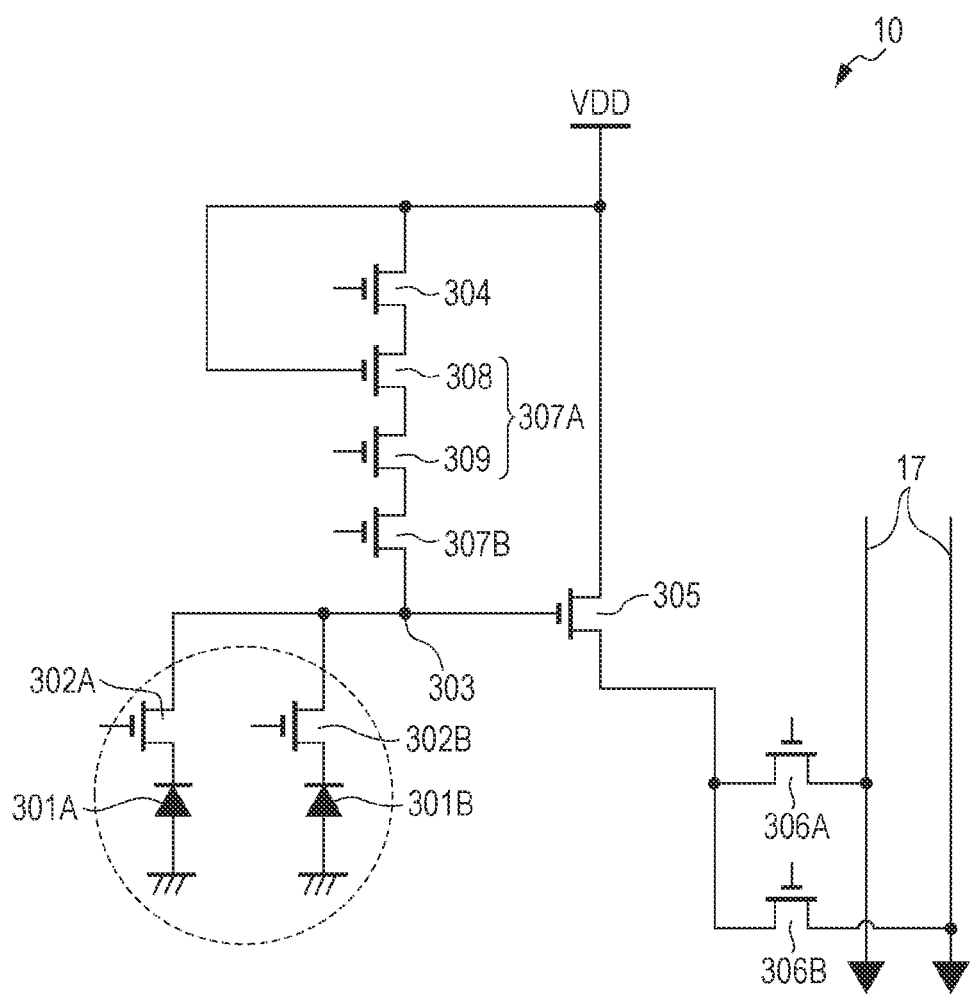
FIG. 2 is a circuit diagram of a pixel in the first embodiment.

FIG. 2 illustrates an exemplary pixel circuit constituting the pixel 10. The pixel circuit includes photoelectric conversion elements 301A and 301B, transfer transistors 302A and 302B, a reset transistor 304, an amplification transistor 305, selection transistors 306A and 306B, and capacitance addition transistors 307A and 307B. The capacitance addition transistor 307A includes a switch transistor 309 and a capacitor 308. The pixel circuit is supplied with a reference potential. Referring to FIG. 2, a power supply voltage (e.g., VDD voltage) is supplied as a reference potential to the drain of the amplification transistor 305, the drain of the reset transistor 304, and the gate of the capacitor 308. Furthermore, a ground voltage (e.g., GND voltage) is supplied as a reference potential to the photoelectric conversion elements 301A and 301B and wells in the semiconductor element layer. The VDD voltage is, for example, 3.3 V, and the GND voltage is, for example, 0 V.

As illustrated in FIG. 2, each pixel circuit may include multiple photoelectric conversion elements, Or alternatively, each pixel circuit may include one photoelectric conversion element.

The elements included in the pixel circuit will now be described. In the following description, added letters, such as A and B, will be omitted where a description is common to the elements.

Each photoelectric conversion element 301 generates electrons and holes by photoelectric conversion. For example, a photodiode can be used as the photoelectric conversion element 301. Each transfer transistor 302 controls whether to transfer a signal charge produced in the photoelectric conversion element 301 to an ED 303. The reset transistor 304 controls whether to set the potential of the ED 303 or the potential of the photoelectric conversion element 301 to the VDD voltage, serving as the reference potential. Each capacitance addition transistor 307 controls whether to add a capacitance to the ED 303.

The amplification transistor 305 amplifies a signal based on a signal charge transferred to the FD and outputs the signal. Each selection transistor 306 is connected to the amplification transistor 305 and an output line 17. In response to ON of the selection transistor 306, the signal output from the amplification transistor 305 is transmitted to the output line 17. If the pixel circuit does not include a selection transistor, whether to output a signal to the signal line can be controlled by controlling ON/OFF of the amplification transistor. The output line 17 is connected to the signal processing circuit 22 in FIG. 1. Furthermore, a signal from the row scanning circuit 20 in FIG. 1 is supplied to the gates of the transfer transistors 302, the reset transistor 304, the amplification transistor 305, the selection transistors 306, and the capacitance addition transistors 307, thus controlling ON/OFF of those transistors.

The photoelectric conversion apparatus may have a rolling shutter function that causes signals to be sequentially read row by row from one side of the pixel region to the opposite side or may have a global shutter function that causes charges in the whole of the pixel region to be simultaneously transferred and accumulated. In the pixel region, exposure time periods may vary by block including multiple pixels.

It is assumed herein that the pixel circuits like that illustrated in FIG. 2 are arranged in the chip 1. The elements other than the photoelectric conversion elements 301 of each pixel may be arranged in the chip 2 so that each photoelectric conversion element 301 is allowed to have a sufficient area without increasing the area of the chip 1.

Figure 3:
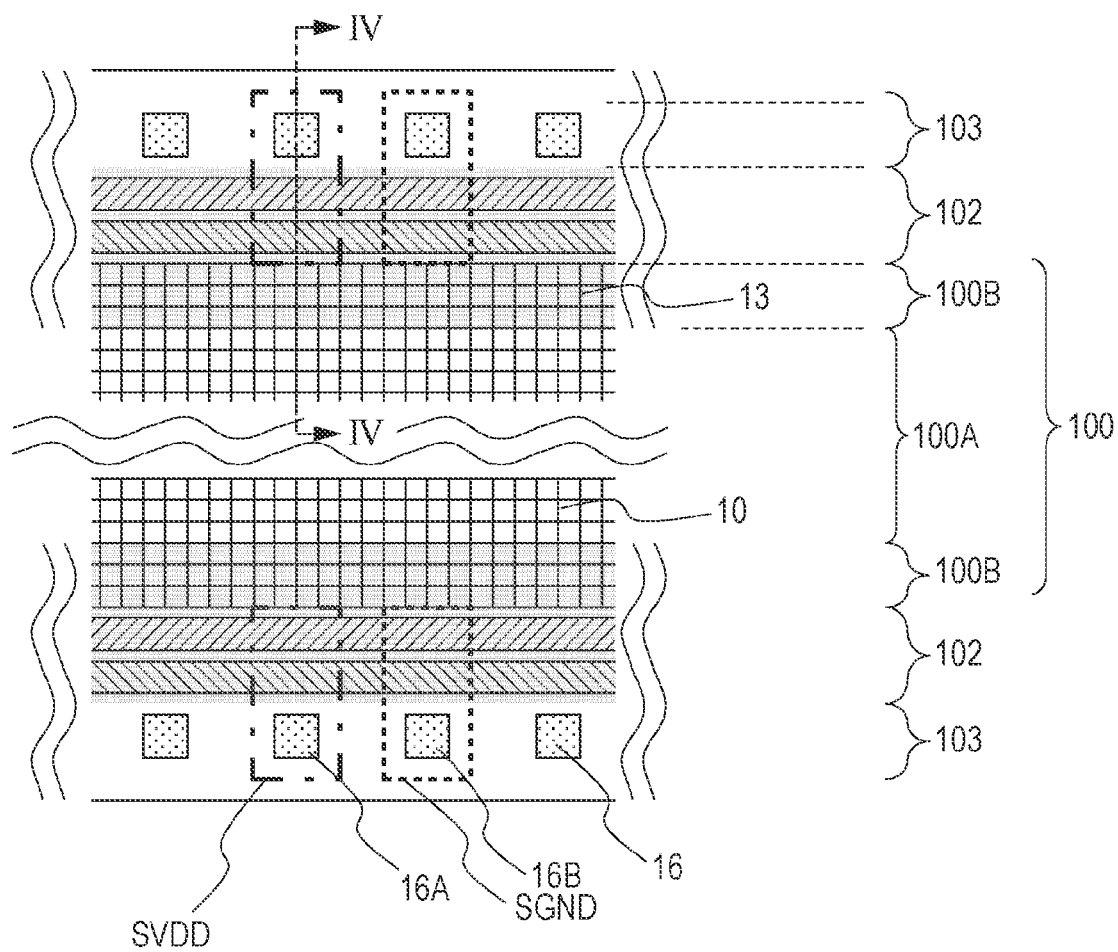
FIG. 3 is a schematic plan view of a chip in the first embodiment.

FIG. 3 is a schematic plan view of the chip 1 illustrating the semiconductor element layer 11 and a light-shielding film 13. The semiconductor element layer 11 has a pixel region 100 a peripheral region 102, which is located outside the pixel region 100 in plan view, and a pad region 103, which is located between the peripheral region 102 and the edge of the semiconductor element layer 11 in plan view. Although the peripheral region 102 and the pad region 103 are arranged on upper and lower sides of the pixel region 100 in plan view in FIG. 3, the arrangement of these regions is not limited to this example. The peripheral region 102 has to be located at least between one side of the pixel region 100 and the edge of the semiconductor element layer 11 in plan view.

In FIG. 3, the pixel region 100 includes an optical black (OB) pixel region 100B, in which multiple OB pixels are arranged, and an effective pixel region 100A, which has no light-shielding film 13 and in which pixels can receive light. The OB pixel region 100B has the light-shielding film 13, which shields the photoelectric conversion elements from incident light. The light-shielding film 13 is superposed on the pixels 10 arranged in proximity to the peripheral region 102 in plan view. The OB pixels are superposed on the light-shielding film 13 in plan view, and detect a reference value of a black level. The OB pixel region 100B is optional. The peripheral region 102 may be next to the effective pixel region 100A.

The peripheral region 102 has, for example, wiring lines to which a reference potential is supplied.

The pad region 103 has a plurality of trenches that form pads 16 through which electrical signals are inputted and outputted. The pads 16 include a pad 16A through which the VDD voltage is supplied to the pixel circuits and a pad 16B through which the GILD voltage is supplied to the pixel circuits.

The boundary between the pad region 103 and the peripheral region 102 can be defined by, for example, the light-shielding film 13. As illustrated in FIG. 3, the peripheral region 102 can be defined as a region having no photoelectric conversion element and having the light-shielding film 13, and the pad region 103 can be defined between the edge of the light-shielding film 13 and the edge of the semiconductor element layer 11. Or alternatively, the pad region 103 may be defined between the edge of the semiconductor element layer 11 and edges of the trenches forming the pads 16 that are adjacent to the pixel region 100 at a rear surface of the semiconductor element layer 11, and the peripheral region 102 may be defined as a region inside the pad region 103 defined in that manner. As illustrated in FIG. 3, the peripheral region 102 can, but does not necessarily have to, have the light-shielding film 13 so that light does not enter the OB pixel region 100B. The whole of the peripheral region 102 does not have to have the light-shielding film 13. A portion of the peripheral region 102 that is close to the OB pixel region 100B has the light-shielding film 13, and a portion of the peripheral region 102 that is remote from the OB pixel region 100B does not have to have the light-shielding film 13.

Figure 4:
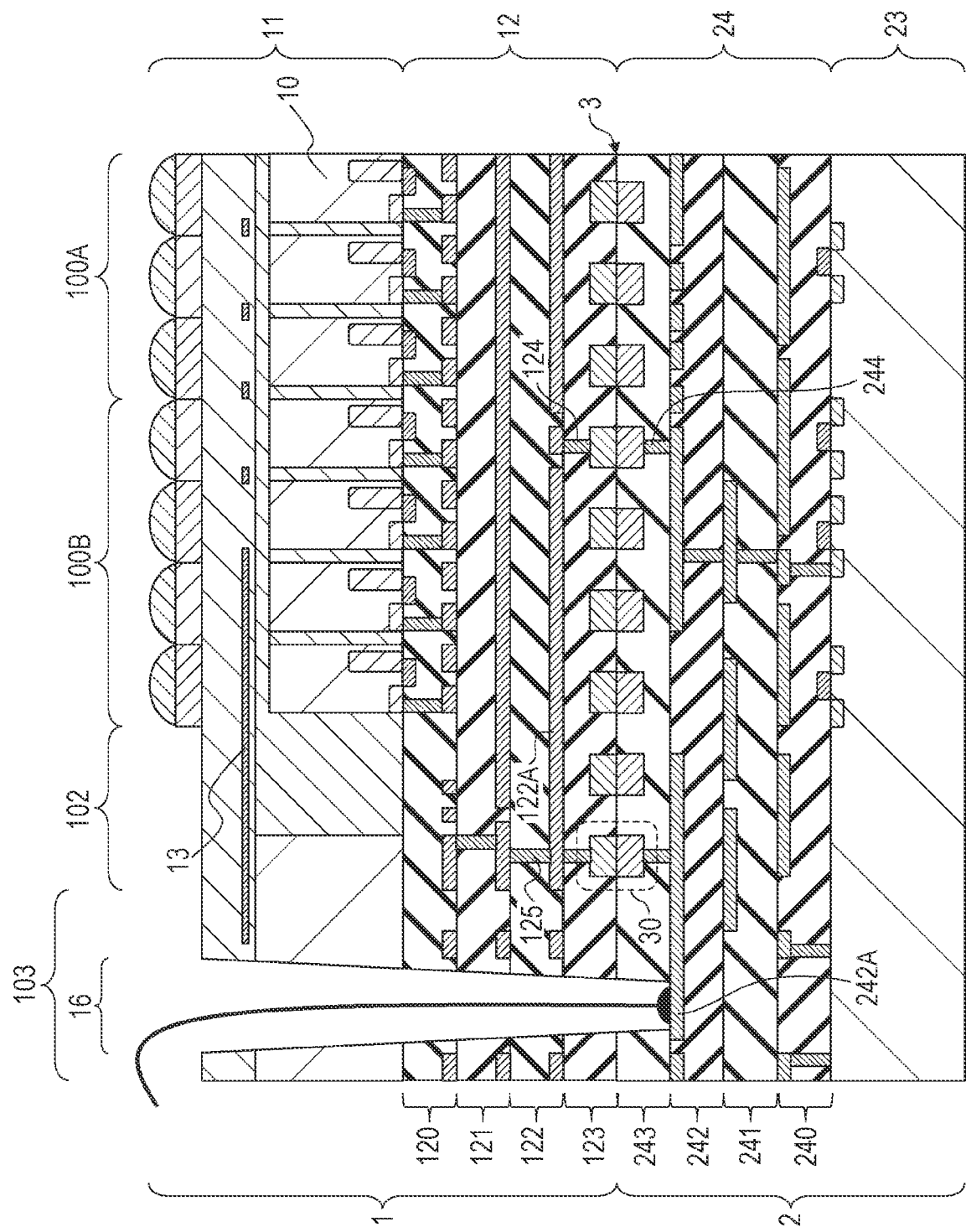
FIG. 4 is a schematic sectional view of the photoelectric conversion apparatus according to the first embodiment.

FIG. 4 is a schematic sectional view of the photoelectric conversion apparatus taken along line IV-IV in FIG. 3 illustrating the concept of a structure of the apparatus. The chips 1 and 2 are stacked and joined at an interface 3, The wiring structure 12 of the chip 1 and the wiring structure 24 of the chip 2 are interposed between the semiconductor element layer 11 of the chip 1 and the semiconductor element layer 23 of the chip 2. Referring to FIG. 4, the wiring structure 12 including the M layers includes four wiring layers, or wiring layers 120, 121, 122, and 123, The wiring structure 24 including the N layers includes four wiring layers, or wiring layers 240, 241, 242, and 243. The number of wiring layers in each wiring structure is not limited to the above-described example. The number of wiring layers may be greater than 4 or may be less than 4.

Each wiring layer includes one or more wiring patterns and an insulating material disposed between elements of the wiring patterns. For example, the wiring layer 122 (first wiring layer) includes a wiring pattern 122A (first wiring pattern), The term "wiring pattern included in each wiring layer" refers to a pattern of wiring lines in the same layer. Two patterns of different wiring lines in the same layer are referred to herein as a wiring pattern XA and a wiring pattern XB. The wiring pattern XA and the wiring pattern XB may be wiring lines to transmit different potentials.

In the following description, for example, it is assumed that the wiring pattern 122A includes wiring lines to supply the VDD voltage to the reset transistors and the amplification transistors and a wiring pattern 122E includes wiring lines to supply the GND voltage to the wells in the semiconductor element layer 11.

The wiring patterns in the wiring layers 120, 121, 122, 123, 240, 241, 242, and 243 are made of a metal material. A main component of the wiring patterns in the wiring layers 120, 121, 122, 123, 240, 241, 242, and 243 can be copper. If the main component is copper, it indicates that copper accounts for more than 50% of a composition as a material. For the wiring patterns in the wiring layers 120, 121, 122, 123, 240, 241, 242, and 243, a component that accounts for more than 90% of the composition can be copper. The wiring lines may be made of another metal, such as aluminum or tungsten. The wiring layers 123 and 243 including the wiring patterns forming metal junctions may include copper as a main component, the wiring layers other than the wiring layers 123 and 243 may include another metal, such as aluminum or tungsten, as a main component, Via plugs interconnecting the wiring layers and contact plugs connecting each wiring layer to the gates of the transistors or connecting the wiring layer to the semiconductor element layer are also made of metal, such as copper, aluminum, or tungsten.

Each of the wiring patterns in the wiring layers 123 and 243 is embedded in recesses in an interlayer insulating layer. The wiring patterns in the wiring layers 123 and 243 can be formed by a damascene process. The wiring pattern in the wiring layer 123 and the wiring pattern in the wiring layer 243 are joined together to form metal junctions 30. An insulating material forming the wiring layer 123 and an insulating material forming the wiring layer 243 are in contact with each other and joined together.

In this embodiment, the metal junctions 30 include at least a metal junction (first metal junction) connecting the semiconductor element layer 11 and the semiconductor element layer 23 to each other. The metal junctions 30 may include a metal junction (second metal junction) that is connected to one of the semiconductor element layers 11 and 23 and is not connected to the other one of the layers. Furthermore, the metal junctions 30 may include a metal junction (third metal junction) that is not connected to the semiconductor element layers 11 and 23.

Referring to FIG. 4, each wiring layer has via plugs are in the insulating material. The wiring pattern in each wiring layer is in electrical connection with the wiring pattern in another wiring layer overlying or underlying the wiring layer through the via plugs. Via plugs 124 arranged in the insulating material of the wiring layer 123 achieve electrical connection between the metal junctions 30 and the wiring pattern in the wiring layer 122. Via plugs 125 achieves electrical connection between the wiring pattern in the wiring layer 122 and the wiring pattern in the wiring layer 121. Via plugs 244 arranged in the insulating material of the wiring layer 243 achieve electrical connection between the wiring pattern, forming the metal junctions 30, in the wiring layer 243 and the wiring pattern in the wiring layer 242. The via plugs are optional. The wiring pattern in a certain wiring layer may be disposed in direct contact with the wiring pattern in another wiring layer overlying or underlying the wiring layer without via plugs. Furthermore, the via plugs may be formed integrally with the wiring pattern, forming the metal junctions 30, in the wiring layer 123. For example, the via plugs 244 may be formed integrally with the wiring pattern, forming the metal junctions 30, in the wiring layer 243. The wiring pattern and the via plugs can be formed integrally by using a dual damascene process. The dual damascene process can be used for another metal junction.

The pads 16 each have at least a trench and a portion of a wiring pattern in a wiring layer. Referring to FIG. 4, a wiring pattern 242A in the wiring layer 242 in the chip 2 serves as a pad electrode to which the VDD voltage is supplied. Although not illustrated in FIG. 4, pad electrodes to which the GND voltage is supplied are similarly arranged in the wiring layer 242.

The trench extends through the chip 1 and the wiring layer 243 and has such a depth that the wiring pattern 242A is exposed. The trench has to extend through at least the semiconductor element layer 11. The wiring pattern 242A can contain aluminum. The pad region 103 has the trench of the pad 16 and at least a portion of the pad electrode. In other words, a portion of the pad electrode may be disposed in the pad region 103, and another portion thereof may be disposed in the peripheral region 102. In each schematic plan view, areas with the trenches in plan view are illustrated as the pads 16 for the sake of convenience. The wiring layer 242 included in the chip 2 is connected to a wire, through which an input or output voltage is transmitted, by wire bonding.

Although FIG. 4 illustrates an example of wire bonding, a through via (through-silicon via (TSV)), which is a trench filled with metal, may be used. If TSVs are used, a signal may be transmitted through the metal junctions 30, as illustrated in FIG. 4, or alternatively, a signal may be transmitted not through the metal junctions 30 but through the via plugs. In the latter case, insulating materials may define the interface 3, and after that, the wiring structure in the chip 1 may be connected to the wiring structure of the chip 2 by the TSVs.

Figure 5A:
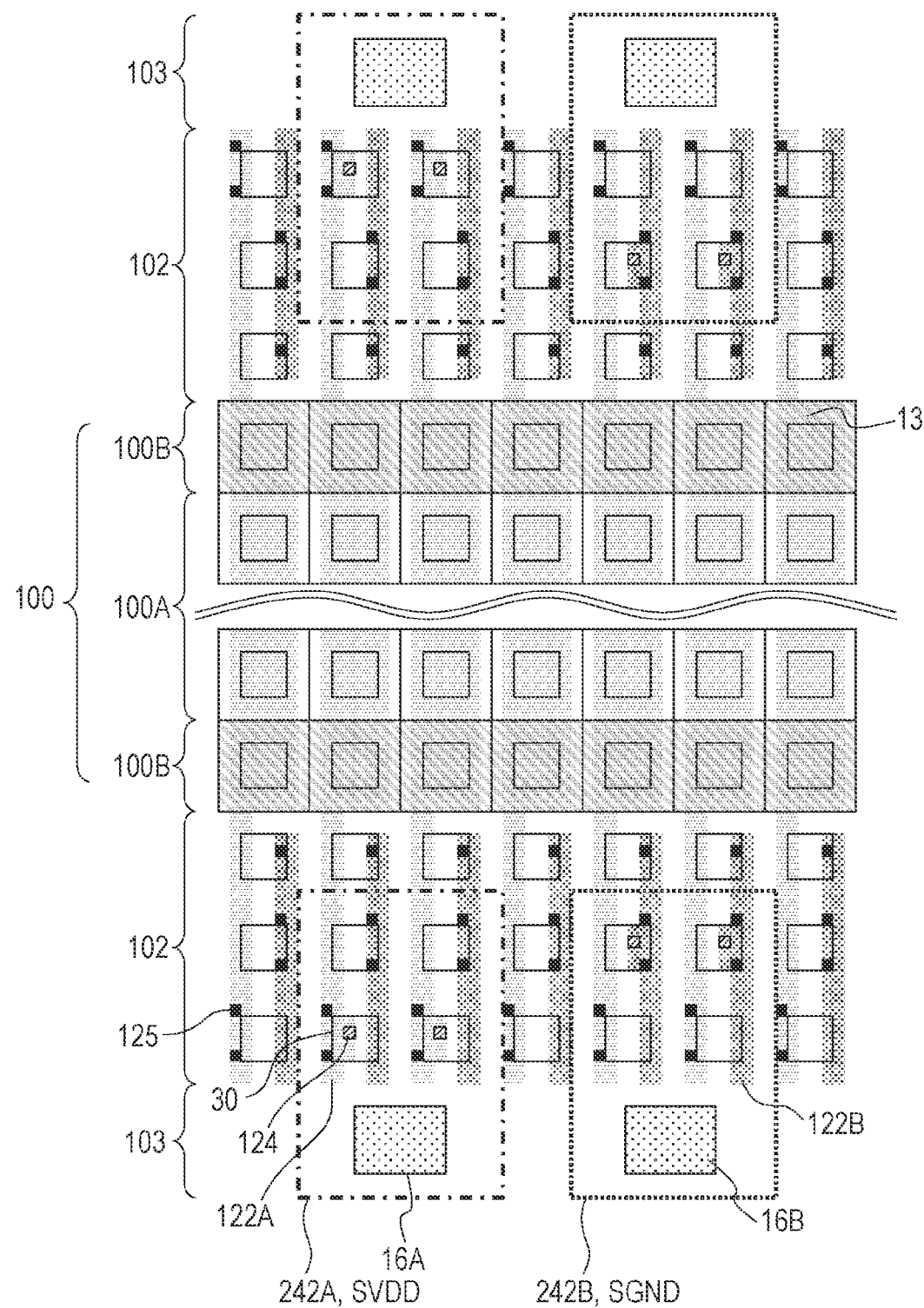
FIG. 5A is a schematic plan view of a wiring layer in the first embodiment.

FIG. 5A is a schematic plan view illustrating details of areas surrounding the pad 16A and the pad 16B in the schematic plan view of FIG. 3 illustrating the semiconductor element layer 11. FIG. 5A mainly schematically illustrates the wiring patterns in the wiring layer 122. FIG. 5A illustrates a layout, in the peripheral region 102, of the via plugs 125 connected to the wiring patterns in the wiring layer 122, the metal junctions 30, and the via plugs 124 in the wiring layer 123. Although the via plugs 124 and 244 are not illustrated at the metal junctions 30 in the pixel region 100, the via plug 124 is connected to at least one of the metal junctions 30 in the pixel region 100. FIG. 5A further illustrates the light-shielding film 13 in the OB pixel region 100B.

Although each metal junction 30 is illustrated as a quadrangle in plan view in FIG. 5A, the metal junction 30 may have any other shape, for example, a quadrangle with rounded corners or a circle. The via plugs 124 connect the wiring pattern 122A in the wiring layer 122 to the metal junctions 30.

In FIG. 5A, an alternate long and short dashed line represents the wiring pattern 242A forming the pad 16A, to which the VDD voltage is supplied. A dotted line represents a wiring pattern 242B forming the pad 16B, to which the GND voltage is supplied. The pads 16A and 16B may be arranged alternately.

Referring to FIG. 5A, in the peripheral region 102, the wiring pattern 242A, to which the VDD voltage is supplied, and the wiring pattern 242B, to which the GND voltage is supplied, are arranged. The VDD voltage is supplied to the wiring pattern 122A via the wiring pattern 242A, and the GND voltage is supplied to the wiring pattern 122B via the wiring pattern 242B. In other words, the wiring layer 122 in the peripheral region 102 has the wiring pattern 122A, to which the VDD voltage is supplied, and the wiring pattern 122B, to which the GND voltage is supplied. The wiring layer 122 in the pixel region 100 has the wiring pattern 122A, to which the VDD voltage is supplied. That is, the wiring layer 122 in the pixel region 100 does not have the wiring pattern 122B. In other words, the wiring pattern 122A in the wiring layer 122 in the pixel region 100 has a uniform layout of wiring lines. As described above, the wiring pattern 122A in the pixel region 100 has a higher wiring density than the wiring pattern 122A in the peripheral region 102. The term "wiring density of a wiring pattern" as used herein refers to the total area of wiring lines of the wiring pattern per unit area.

Of the pads 16, the pads 16A and 16B, to which the reference potentials are supplied, can be formed in a location with little voltage drop. In other words, the wiring patterns to which the reference potentials are supplied can be arranged in the peripheral region 102 close to the pad region 103. This restricts the wiring patterns to which the GND voltage and the VDD voltage are supplied in the vicinity of the pad region 103 in the chip 1 having the pixel circuits. In contrast, in the pixel region, in which the pixel circuits are arrayed, in the chip 1, the density of the wiring pattern can be made higher than that in the peripheral region 102 to reduce the influence of coupling due to potential fluctuation in the electric-circuit chip. This allows the wiring pattern to have a low impedance, reducing the degradation of characteristics caused by smear and shading.

In this embodiment, as described above, the density of the wiring pattern for reference potential supply in the pixel region 100 is made higher than that in the peripheral region. This reduces the influence of coupling due to potential fluctuation in the electric-circuit chip in the arrangement of the wiring patterns for reference potential supply in a location with little voltage drop.

Referring to FIG. 4, the pad electrode is disposed in the chip 2. The wiring layer 123, which is the lowermost wiring layer in the chip 1 has the wiring pattern forming the metal junctions 30. Therefore, the wiring layer 122, which is the second closest to the pad electrode, has a wiring layout that satisfies the above-described relationship between the densities. In other words, the wiring layer 122 next to the wiring layer 123 providing the metal junctions 30 has the above-described relationship between the densities.

In a case where the chip 2 having pad electrodes is joined to the chip 1 at the metal junctions 30, the metal junctions 30 in proximity to the pad electrodes have to be connected to the wiring patterns 122A and 122B to reduce the influence of voltage drop. In other words, in the case where the chip 2 having the pad electrodes is joined to the chip 1 at the metal junctions 30, the wiring patterns in the wiring layer 122 tend to be restricted. In this case, advantages offered by this embodiment become more pronounced.

If the chip 1 has the pad electrodes, a wiring layer including the pad electrodes can satisfy the above-described relationship between the densities.

As illustrated in FIG. 5A, the wiring pattern 212A forming the pad electrodes continuously extends from the pad region 103 to the peripheral region 102 so as to overlap the peripheral region 102 in plan view. In other words, in the peripheral region 102 in plan view, the wiring pattern 242A forming the pad electrodes overlaps the wiring pattern 122A. In the peripheral region 102, the wiring pattern 242A is connected to the wiring pattern 122A in the chip 1 by the via plugs 244, the metal junctions 30, and the via plugs 124. Similarly, the wiring pattern 212B, to which the GND voltage is supplied, in the wiring layer 242 is connected to the wiring pattern to which the CND voltage is supplied in the chip 1 by the via plugs, the metal junctions 30, and the via plugs in the peripheral region. Such shortest-distance connection between the wiring patterns for reference potential supply to the pixel circuits leads to less voltage drop in the pads 16, thus reducing the influence of voltage drop.

In the first embodiment, the width of the wiring pattern 122A in the pixel region 100 is greater than that in the peripheral region 102, thus increasing the wiring density. The wiring density may be increased in any other manner.

In comparison between the pixel region 100 and the peripheral region 102 that have the same area, the wiring density in the pixel region 100 is higher than that in the peripheral region 102. For example, in the wiring layer 122 in plan view, the wiring density in a first region that includes three or more pixel circuits in the pixel region 100 may be compared with the wiring density in a second region that is located in the peripheral region 102 and has the same area as that of the first region. Three or more pixels are, for example, ten pixels. Alternatively, the wiring density of the wiring pattern 122A in a 1000-by-1000-micrometer portion of the pixel region 100 may be compared with that in a 1000-by-1000-micrometer portion of the peripheral region 102.

The wiring density of the wiring pattern 122A in the pixel region 100 is preferably 1.5 times or more, more preferably 2 times or more higher than that in the peripheral region 102.

Figure 5B:
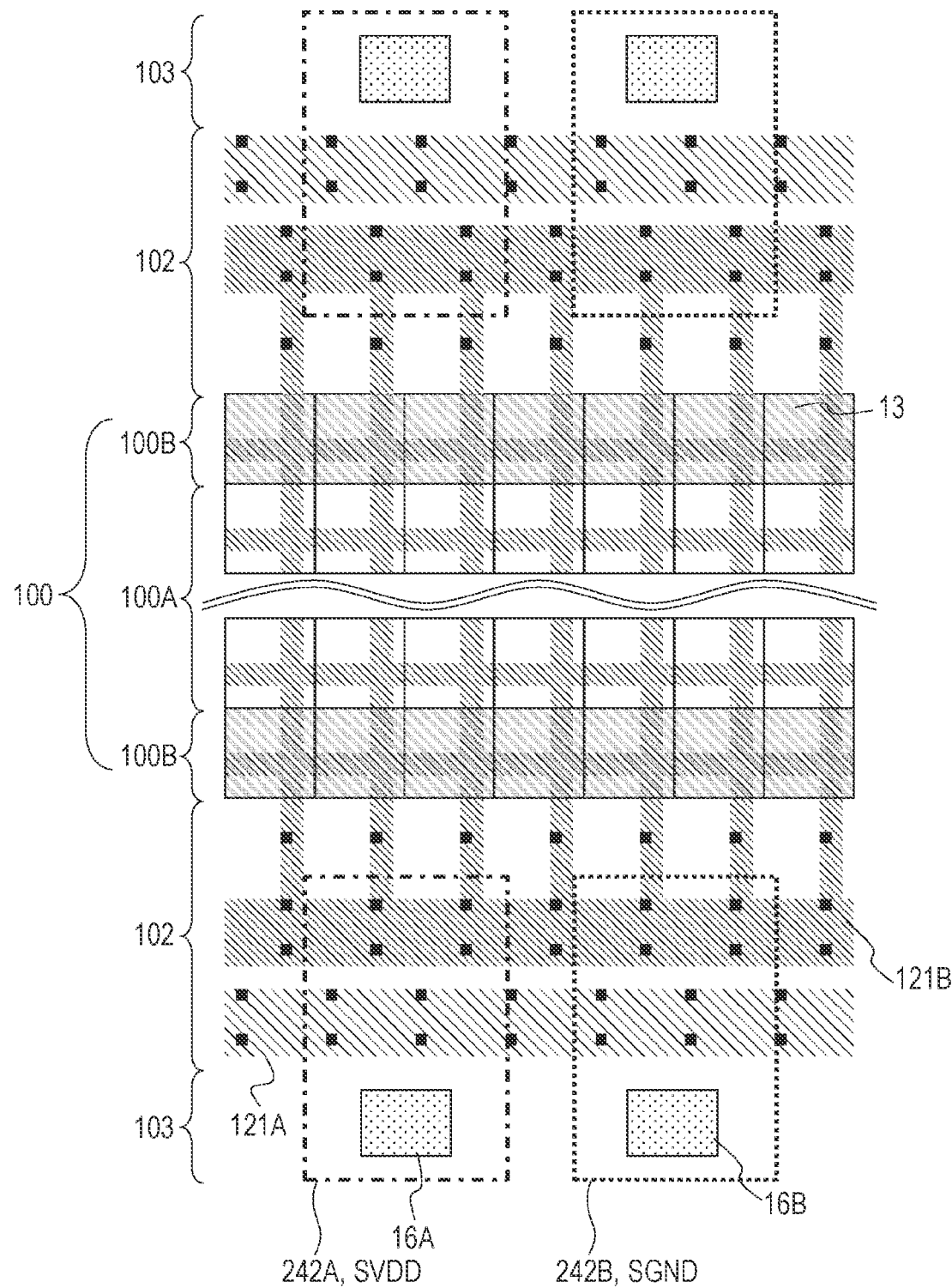
FIG. 5B is a schematic plan view of a wiring layer in the first embodiment.

Although the wiring pattern 122A can be uniformly disposed in the pixel region 100 so that the effect of reducing impedance and the effect of reducing the influence of coupling due to potential fluctuation in the chip 2 become more pronounced, any other arrangement may be used. The wiring pattern 122B may be disposed in a portion of the pixel region 100 as long as the above-described relationship between the wiring densities is satisfied. This arrangement offers certain advantages over arrangement with the same wiring density in reducing the impedance and reducing the influence of coupling due to potential fluctuation in the chip 2. In the pixel region 100, a portion of the wiring layer 122 may include a wiring pattern through which signals from the pixel circuits are transmitted, FIG. 5B is a schematic plan view of the wiring patterns in the wiring layer 121. The peripheral region 102 has a wiring pattern 121A to which the VDD voltage is supplied and a wiring pattern 121B to which the GND voltage is supplied. The wiring pattern 121A is connected to the wiring pattern 122A in the wiring layer 122 by the via plugs 125. The wiring pattern 121B is connected to the wiring pattern 122B in the wiring layer 122 by the via plugs 125, In the peripheral region 102, the voltage received from the pad 16A can be supplied in a lateral direction of the chip through the wiring pattern 121A. Similarly, the voltage received from the pad 16B can be supplied in the lateral direction of the chip through the wiring pattern 121B. The wiring pattern 121B has a mesh shape in the pixel region 100. The wiring pattern 121B continuously extending from top to bottom and from side to side in the pixel region 100 allows the voltage received from the pad 16B to be supplied in the lateral direction of the chip.

In the above description with reference to FIGS. 5A and 5B, the wiring pattern 122A in the wiring layer 122 is a wiring pattern to supply the VDD voltage, and the wiring pattern 121B in the wiring layer 121 is a wiring pattern to supply the GND voltage. Since a wiring layer closer to the metal junctions 30 is relatively less restricted in design, the wiring pattern to supply the VDD voltage, which has to be prevented from dropping, is disposed close to the wiring pattern 242A forming the pad electrodes, and the wiring pattern to supply the GND voltage is disposed remote from the wiring pattern 242A. This arrangement allows the wiring pattern 122A to have a greater width, leading to lower wiring resistance. This enables supply of a high voltage. However, the wiring layer 122 may include a wiring pattern to supply the GND voltage, and the wiring layer 121 may include a wiring pattern to supply the VDD voltage. In such a case where the wiring pattern in the wiring layer 122 includes wiring lines to supply the GND voltage, the impedance of the wiring lines can be reduced, and the influence of coupling due to potential fluctuation in the chip 2 can also be reduced. Therefore, the first embodiment includes the arrangement of the wiring pattern to supply the GND voltage in the wiring layer 122.

Second Embodiment

A photoelectric conversion apparatus according to a second embodiment will be described with reference to FIGS. 6A and 6B.

Figure 6A:
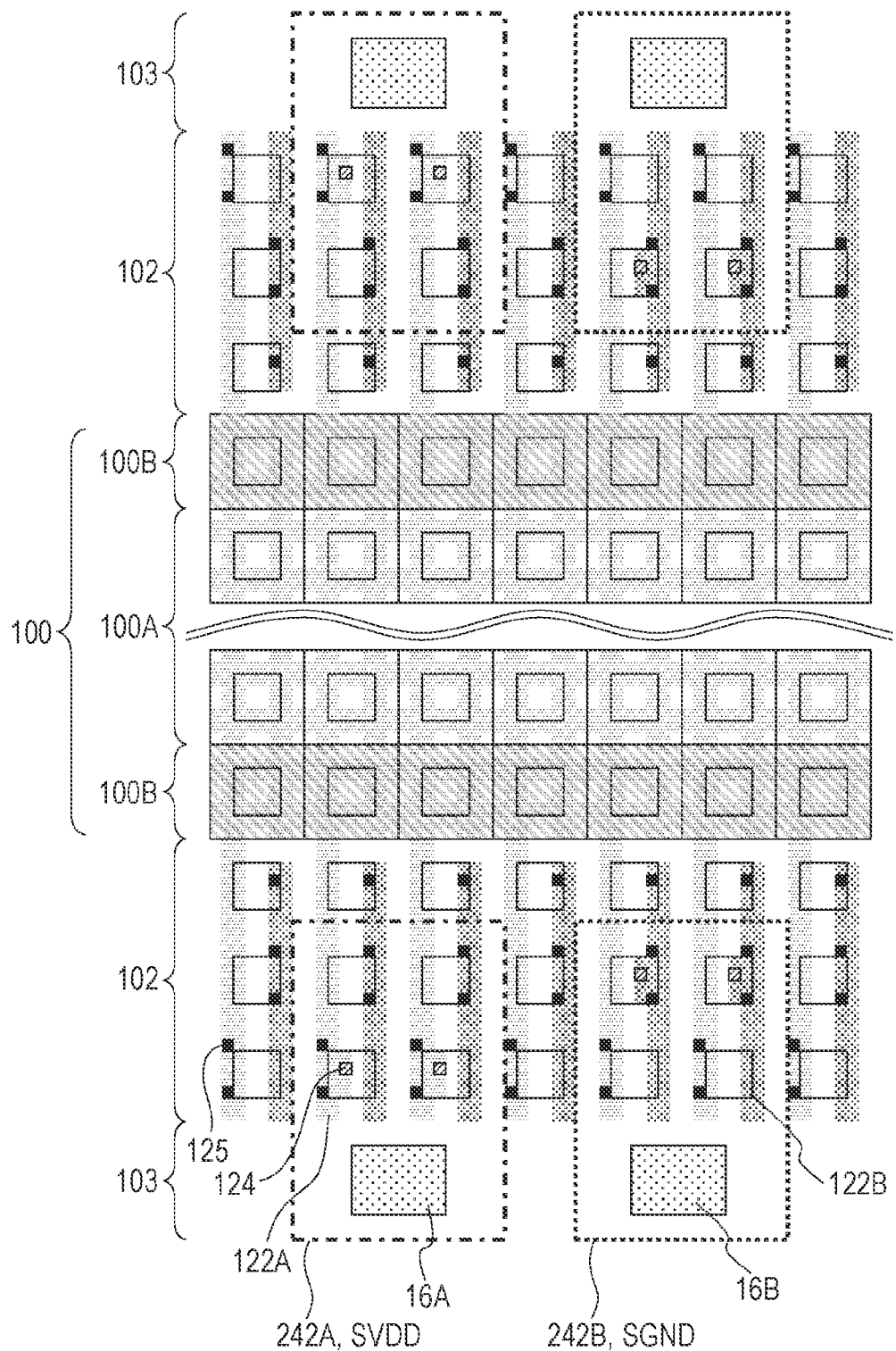
FIG. 6A is a schematic plan view of a wiring layer in a second embodiment.

FIG. 6A is a schematic plan view mainly illustrating wiring patterns in the wiring layer 122. FIG. 6A illustrates a layout of the via plugs 125, the metal junctions 30, and the via plugs 124 in the wiring layer 123 connected to the wiring patterns in the wiring layer 122 in the peripheral region 102. Although the via plugs 124 and 244 are not illustrated at the metal junctions 30 arranged in the pixel region 100, the via plug 124 is connected to at least one of the metal junctions 30 in the pixel region 100. FIG. 6A further illustrates the light-shielding film 13. FIG. 6B is a schematic plan view mainly illustrating the wiring patterns in the wiring layer 121.

The photoelectric conversion apparatus according to the second embodiment differs from the photoelectric conversion apparatus according to the first embodiment in that the wiring pattern in the wiring layer 122 has a mesh shape in a region aligned with the pixel region 100 in plan view. Except for this point and the following features, the photoelectric conversion apparatus according to the second embodiment has features similar to those of the photoelectric conversion apparatus according to the first embodiment. A description of the similar features may be omitted.

To form a wiring pattern by using a damascene process, recesses are filled with copper to form the wiring pattern, and after that, chemical mechanical polishing (CMP) is performed. During CMP, poor formation of the copper wiring pattern, such as a dent in the wiring pattern, may occur in a recess having a thick width. In contrast, according to the second embodiment, the mesh-shaped layout of the wiring pattern 122A in the pixel region 100 avoids a local increase in density of copper in the wiring pattern. This eliminates or minimizes the poor formation during CMP.

In the second embodiment, elements of the wiring pattern in the wiring layer 122 are connected in the lateral direction in the OB pixel region 100B and the effective pixel region 100A. Specifically, a wiring pattern element overlapping the pixels 10 in a certain column and a wiring pattern element overlapping the pixels in the next column are connected in the row direction to constitute one element of the wiring pattern 122A. This results in a further reduction in impedance of the wiring pattern to supply the reference potential. This further reduces the influence of coupling on the pixels 10 due to potential fluctuation in the chip 2.

Figure 6B:
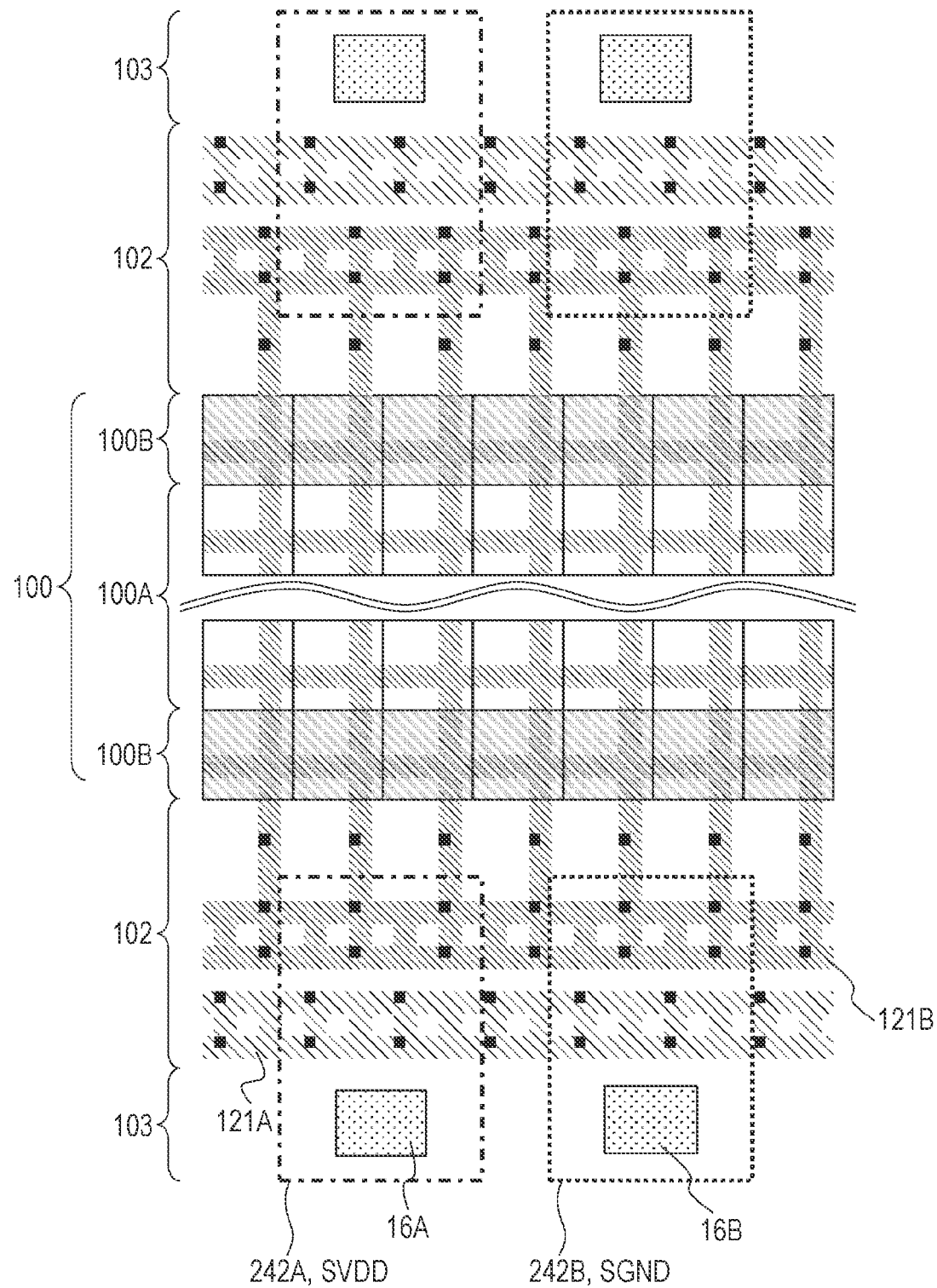
FIG. 6B is a schematic plan view of a wiring layer in the second embodiment.

As illustrated in FIG. 6B, elements of the wiring patterns 121A and 121B in the wiring layer 121 are connected in the lateral direction in the peripheral region 102, In other words, as illustrated in FIG. 6B, the wiring patterns 121A and 121B in the wiring layer 121 each have a mesh shape in the peripheral region 102.

Like the first embodiment, the second embodiment achieves arrangement of the wiring patterns for reference potential supply in a location with little voltage drop, a reduction in impedance of wiring lines in this arrangement, and reduction of the influence of coupling due to potential fluctuation in the chip 2 in the arrangement. Furthermore, the second embodiment achieves a further reduction in impedance, as compared with the first embodiment.

Third Embodiment

Figure 7:
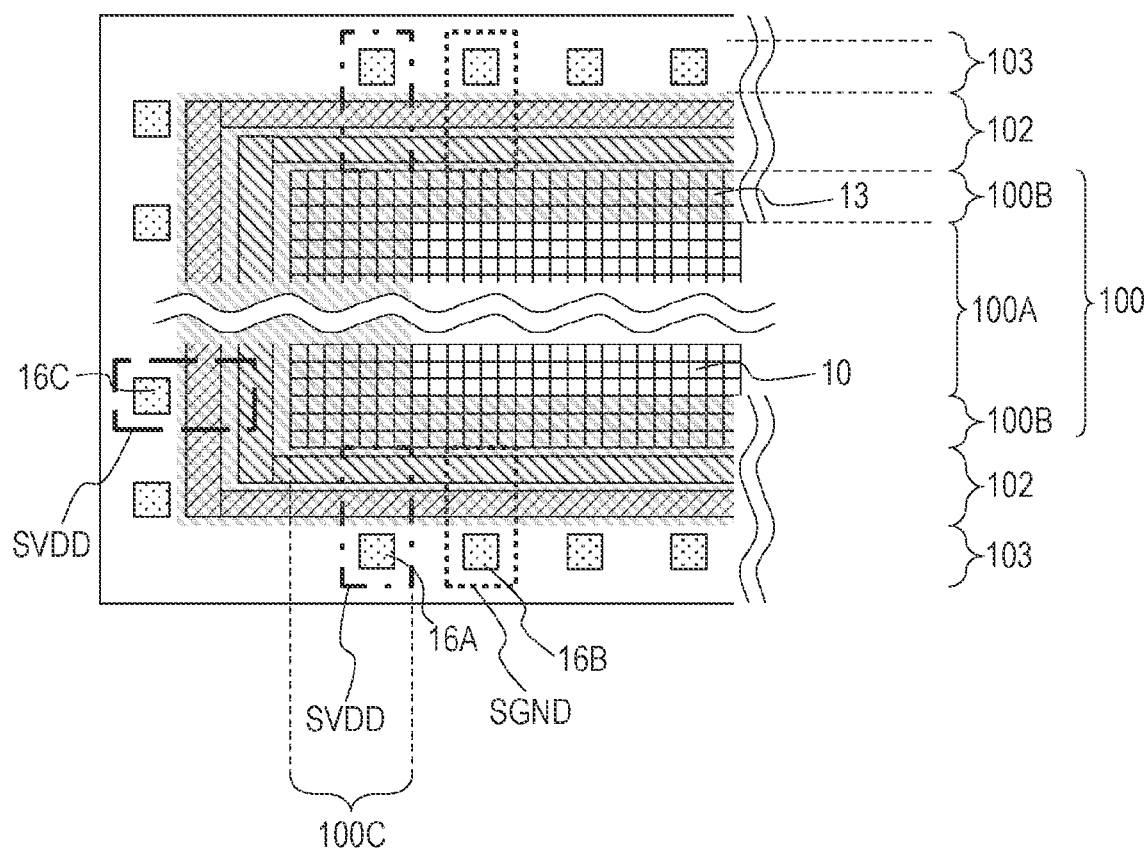
FIG. 7 is a schematic plan view of a chip in a third embodiment.
Figure 8A:
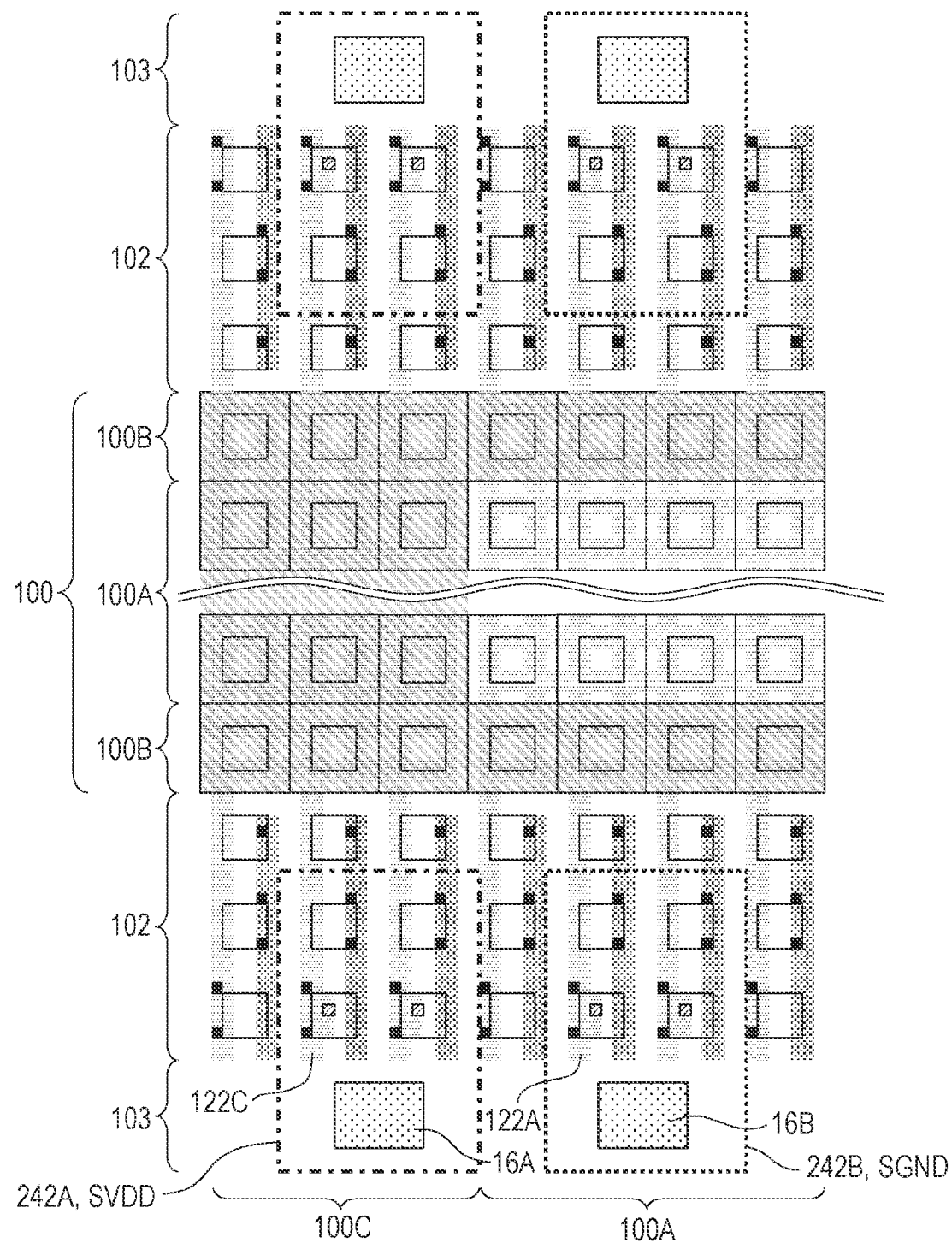
FIG. 8A is a schematic plan view of a wiring layer in the third embodiment.
Figure 8B:
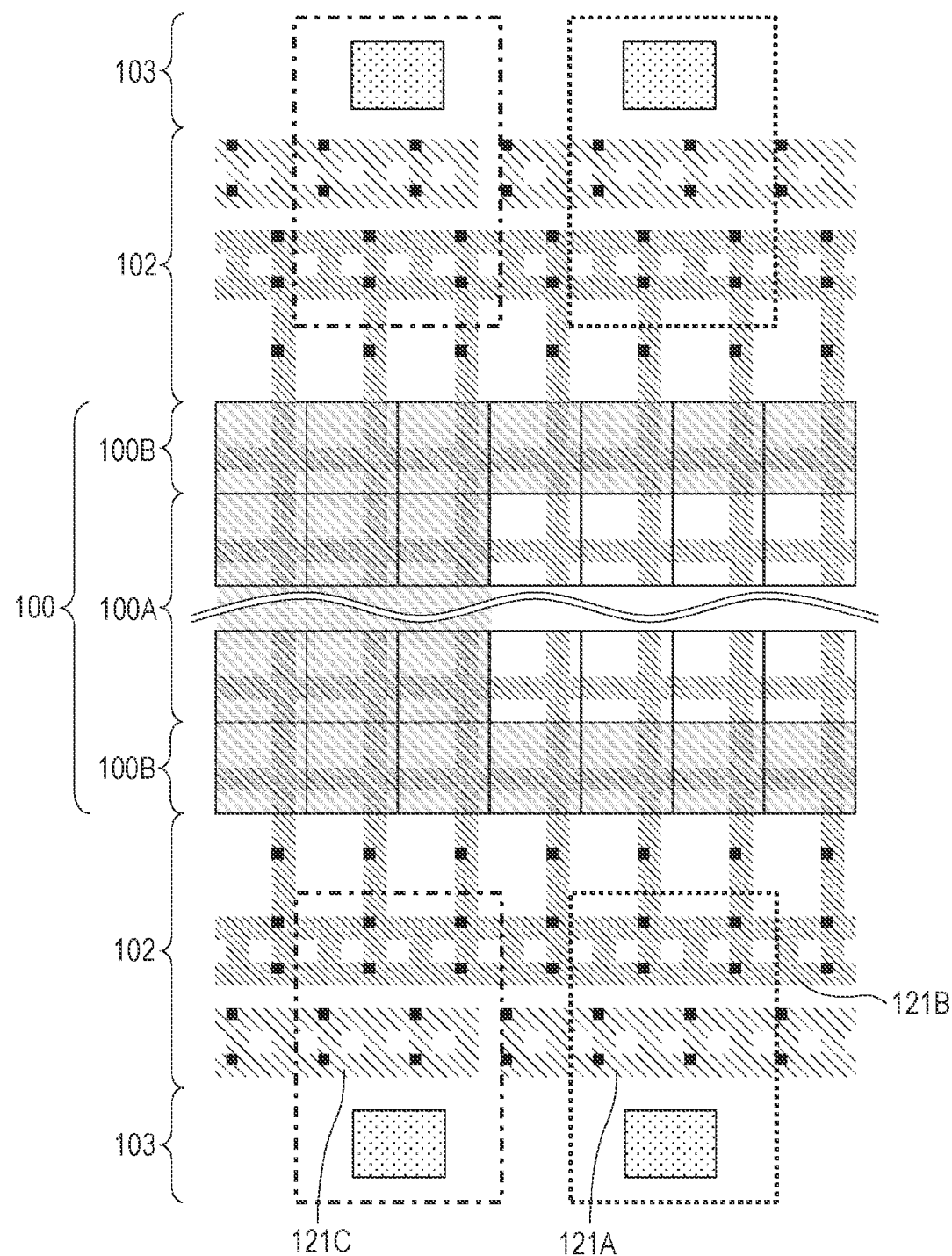
FIG. 8B is a schematic plan view of a wiring layer in the third embodiment.

A photoelectric conversion apparatus according to a third embodiment will be described with reference to FIGS. 7, 8A, and 8B. FIG. 7 is a schematic plan view of the semiconductor element layer 11 and the light-shielding film 13 in the third embodiment. FIG. 7 illustrates a horizontal OB pixel region 100C extending in a horizontal direction. FIGS. 8A and 8B are schematic plan views of wiring patterns illustrating details of an area including the boundary between the effective pixel region 100A and the horizontal OB pixel region 100C. FIG. 8A is a schematic plan view mainly illustrating the wiring patterns in the wiring layer 122. FIG. 8A illustrates a layout of the via plugs 125, the metal junctions 30, and the via plugs 124 in the wiring layer 123 connected to the wiring patterns in the wiring layer 122 in the peripheral region 102. Although the via plugs 124 and 244 are not illustrated at the metal junctions 30 arranged in the pixel region 100, the via plug 124 is connected to at least one of the metal junctions 30 in the pixel region 100. FIG. 8A further illustrates the light-shielding film 13. FIG. 8B is a schematic plan view mainly illustrating the wiring patterns in the wiring layer 121.

The photoelectric conversion apparatus according to the third embodiment differs from the photoelectric conversion apparatus according to the second embodiment in that a wiring pattern in the horizontal OB pixel region 100C is separate from the wiring pattern 122A in the effective pixel region 100A. Except for this point and the following features, the photoelectric conversion apparatus according to the third embodiment has features similar to those of the photoelectric conversion apparatus according to the second embodiment. A description of the similar features may be omitted.

As illustrated in FIG. 7, the horizontal OB pixel region 100C is located to the left of the effective pixel region 100A in FIG. 7. The horizontal OB pixel region 1000 also has the light-shielding film 13. The horizontal OB pixel region 100C is similar to the OB pixel region 100B described in the first embodiment, except for the position of the region.

Referring to FIG. 7, a pad 16C, to which the VDD voltage is applied, is disposed between the horizontal OB pixel region 1000 and the edge of the semiconductor element layer 11. Although the pad 16C is disposed to the left of the horizontal OB pixel region 100C in FIG. 7, the pad 16C may be disposed below the horizontal OB pixel region 100C in FIG. 7.

In the third embodiment, as illustrated in FIG. 8A, the wiring pattern 122A in the wiring layer 122 has a mesh shape in the effective pixel region 100A. The wiring pattern 122A having a mesh shape is separate from a wiring pattern 1220, which is disposed in the horizontal OB pixel region 1000 and to which the same potential as that to the wiring pattern 122A is supplied. In other words, the same potential is applied to the wiring pattern 122A in the effective pixel region 100A and the wiring pattern 122C in the horizontal OB pixel region 100C, but these wiring patterns are not connected to each other in the wiring layer 122. For the pads 16, the pad 16A through which the voltage is applied to the wiring pattern 122A in the effective pixel region 100A is separate from the pad 16C through which the voltage is applied to the wiring pattern 122C in the horizontal OB pixel region 100C.

For example, the VDD voltage is applied to the pads 16A and 167, and is supplied to the wiring patterns 122A and 1220.

As illustrated in FIG. 8B, in the peripheral region 102 in the wiring layer 121, the wiring pattern 121A, to which the VDD voltage is applied, is separate from a wiring pattern 1210, which is located above and below horizontal OB pixels and to which the VDD voltage is applied.

Intense light applied to the pixels 10 in the effective pixel region 100A may cause a significant reduction in voltage of signal lines, resulting in a narrower circuit operation range of a constant current source. This may lead to interruption of current from the constant current source. In such a case, the potential of the wiring pattern 1220, to which the VDD voltage is supplied, in the horizontal OB pixel region 100C may be fluctuated through a wiring pattern 122 to which the VDD voltage is supplied, so that dark signals may fluctuate depending on incident light. The fluctuation of the dark signals depending on incident light may cause image quality degradation, such as smear, in correction using the dark signals.

In the third embodiment, the pad 16A for the effective pixel region 100A is separate from the pad 16C for the horizontal OB pixel region 1000. In addition, the wiring patterns 122A and 121A, to which the VDD voltage is supplied, in the effective pixel region 100A are separate from the wiring patterns 122C and 121C, to which the VDD voltage is supplied, in the horizontal OB pixel region 100C, This arrangement can reduce potential fluctuation of dark signals in the horizontal OB pixel region 100C if intense light applied to the pixels 10 in the effective pixel region 100A causes fluctuation of the VDD voltage to the pixels 10. This enables more accurate correction.

For example, a bypass capacitor can be disposed in the vicinity of the horizontal OB pixel region 100C. This can further reduce potential fluctuation of the VDD voltage in the horizontal OB pixel region 1000. Thus, stable dark signals that are unsusceptible to incident light can be obtained from the horizontal OB pixel region 100C.

In the above description, the VDD voltage is supplied through the pads 16A and 16C. The same advantages can be obtained when the GND voltage is supplied through the pads 16A and 16C.

Like the second embodiment, the third embodiment achieves arrangement of the wiring patterns for reference potential supply in a location with little voltage drop, a reduction in impedance of wiring lines in this arrangement, and reduction of the influence of coupling due to potential fluctuation in the chip 2 in the arrangement. Furthermore, the third embodiment can reduce image quality degradation, such as smear, as compared with the second embodiment.

Fourth Embodiment

Figure 9:
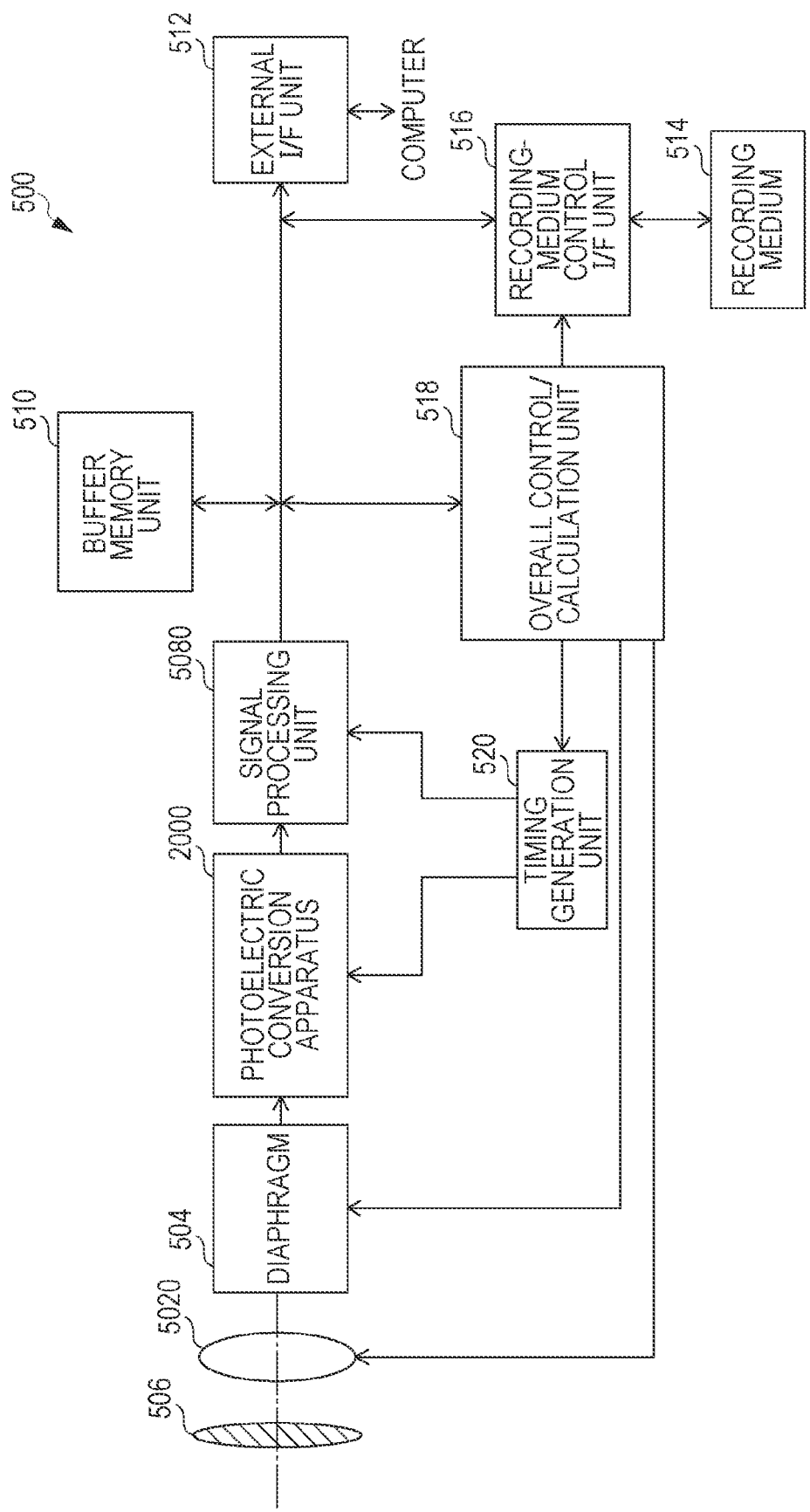
FIG. 9 is a block diagram of a photoelectric conversion system according to a fourth embodiment.

FIG. 9 is a block diagram of a photoelectric conversion system 500 according to a fourth embodiment illustrating an exemplary configuration of the system. The photoelectric conversion system 500 according to the fourth embodiment includes a photoelectric conversion apparatus 2000 having the configuration of any of the above-described photoelectric conversion apparatuses. FIG. 9 illustrates the photoelectric conversion system 500, serving as an imaging system. Examples of the imaging system include, but are not limited to, a digital still camera, a digital camcorder, and a surveillance camera. The photoelectric conversion system 500 includes the photoelectric conversion apparatus 2000, a lens 5020, a diaphragm 504, and a barrier 506 to protect the lens 5020. The photoelectric conversion system 500 includes a signal processing unit (image signal generation unit) 5080 for processing an output signal from the photoelectric conversion apparatus 2000. The signal processing unit 5080 performs a signal processing operation to perform various corrections and compression on an input signal as necessary and output the signal. The signal processing unit 5080 may have a function of performing AD conversion on the output signal from the photoelectric conversion apparatus 2000. The photoelectric conversion system 500 further includes a buffer memory unit 510 to temporarily store image data and an external interface unit (external OF unit) 512 for communication with, for example, an external computer. The photoelectric conversion system 500 further includes a recording medium 514, such as a semiconductor memory, to or from which image data is recorded or read, and a recording-medium control interface unit (recording-medium control I/F unit) 516 to record or read data to or from the recording medium 514.

The photoelectric conversion system 500 further includes an overall control/calculation unit 518 to perform various calculations and control the entire imaging system and a timing generation unit 520 to output various timing signals to the photoelectric conversion apparatus 2000 and the signal processing unit 5080, The photoelectric conversion apparatus 2000 outputs an image signal to the signal processing unit 5080. The signal processing unit 5080 performs predetermined signal processing on the image signal from the photoelectric conversion apparatus 2000 to output image data.

The signal processing unit 5080 generates an image based on the image signal.

The photoelectric conversion system includes any of the photoelectric conversion apparatuses according to the above-described embodiments. Such a configuration allows the imaging system to obtain an image with higher quality.

Fifth Embodiment

Figure 10A:
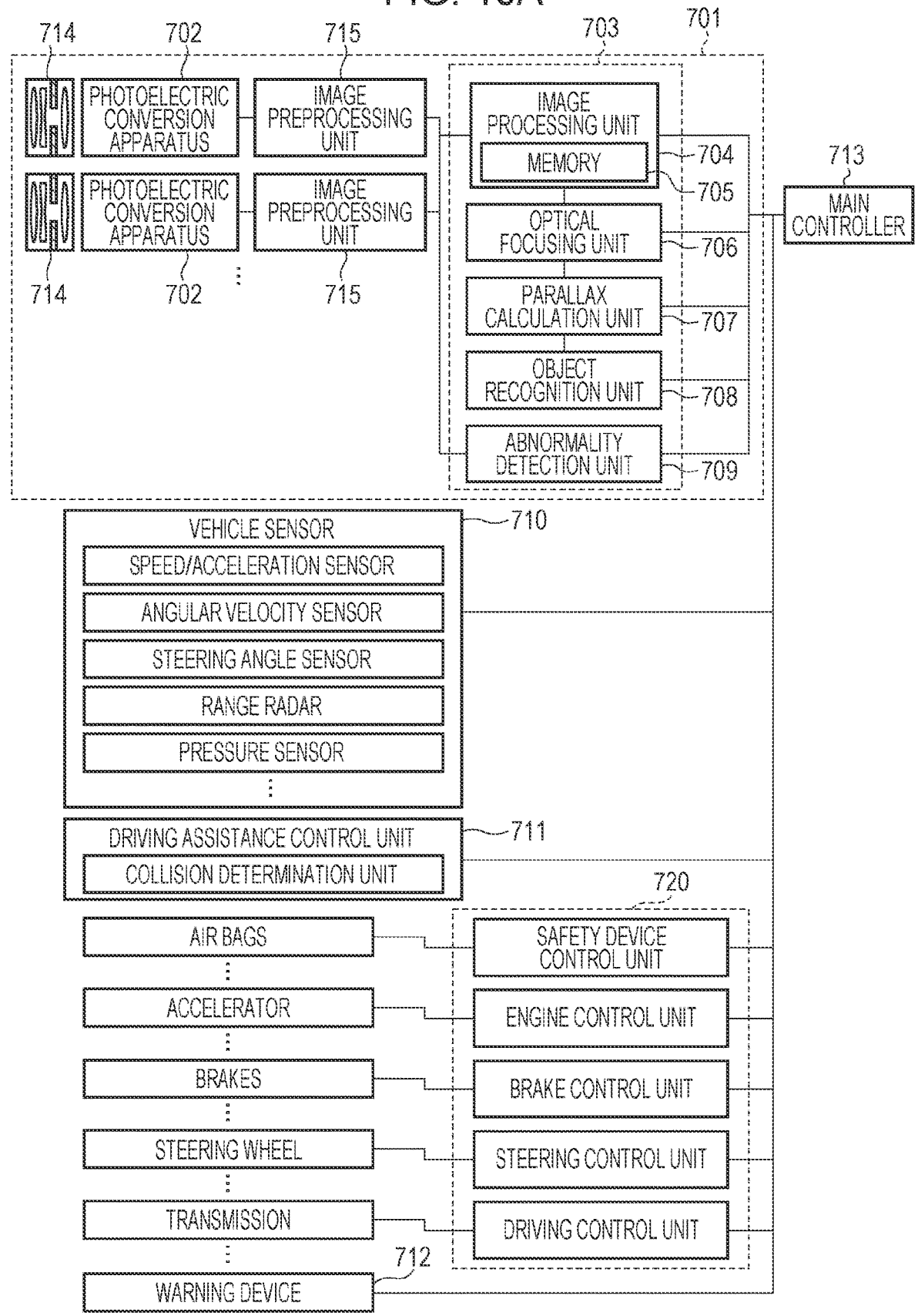
FIGS. 10A and 10B illustrate the concept of a photoelectric conversion system according to a fifth embodiment and a movable object.
Figure 10B:
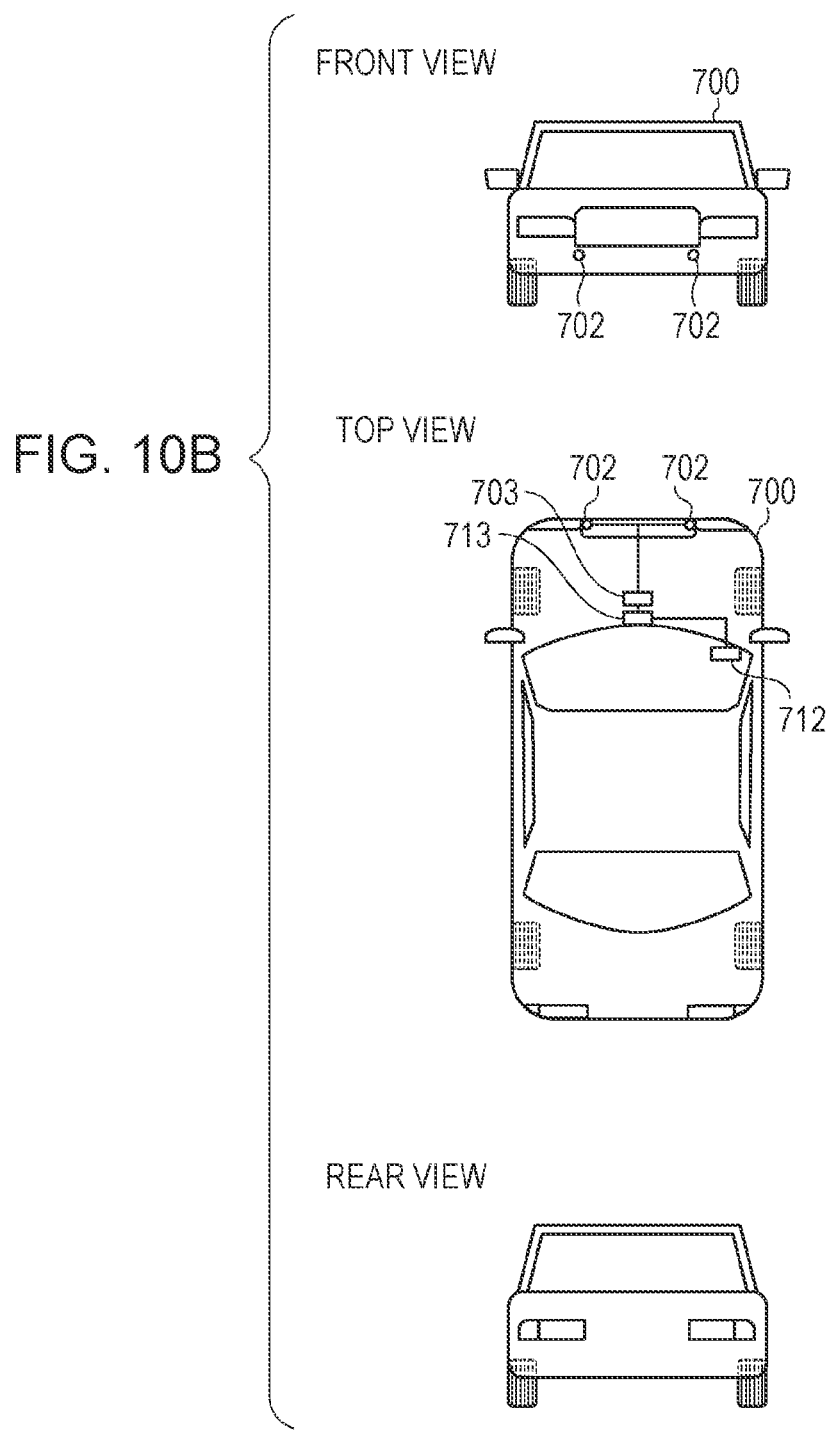

A photoelectric conversion system according to a fifth embodiment and a movable object will be described with reference to FIGS. 10A and 10B. The fifth embodiment illustrates an exemplary imaging system for an on-vehicle camera. FIGS. 10A and 10B illustrate an exemplary vehicle and an exemplary imaging system incorporated in the vehicle. A photoelectric conversion system 701 includes a photoelectric conversion apparatus 702, an image preprocessing unit 715, an integrated circuit 703, and an optical system 714. The optical system 714 forms an optical image of an object on the photoelectric conversion apparatus 702, The photoelectric conversion apparatus 702 converts the optical image of the object formed by the optical system 714 into an electrical signal. The photoelectric conversion apparatus 702 is any of the photoelectric conversion apparatuses according to the above-described embodiments. The image preprocessing unit 715 performs predetermined signal processing on a signal output from the photoelectric conversion apparatus 702, The photoelectric conversion system 701 includes at least two combinations of the optical system 714, the photoelectric conversion apparatus 702 and the image preprocessing unit 715, The integrated circuit 703 receives outputs from the image preprocessing units 715 of the combinations.

The integrated circuit 703, which is used for a photoelectric conversion system, includes an image processing unit 704 including a memory 705, an optical focusing unit 706, a parallax calculation unit 707, an object recognition unit 708, and an abnormality detection unit 709. The image processing unit 704 performs image processing, such as defect correction, on an output signal from each image preprocessing unit 715. The memory 705 temporarily stores data of a captured image and stores data indicating the position of a defect in imaging pixels. The optical focusing unit 706 performs focusing on an object and determines a distance to the object. The parallax calculation unit 707 calculates a parallax (phase difference between parallax images) from multiple pieces of image data acquired from the multiple photoelectric conversion apparatuses 702. The object recognition unit 708 recognizes an object, such as a vehicle, a road, a traffic sign, or a human. When detecting an abnormality at any of the photoelectric conversion apparatuses 702, the abnormality detection unit 709 notifies a main controller 713 of the abnormality.

The integrated circuit 703 may be implemented by dedicatedly designed hardware, a software module, or a combination thereof. Alternatively, the integrated circuit 703 may be implemented by, for example, a field programmable gate array (FPGA), an application specific integrated circuit (ASIC), or a combination thereof.

The main controller 713 performs centralized control of operations of, for example, the photoelectric conversion system 701, a vehicle sensor 710, and a control unit 720. The main controller 713 may be omitted, and each of the photoelectric conversion system 701, the vehicle sensor 710, and the control unit 720 may include a communication interface so that the photoelectric conversion system 701, the vehicle sensor 710, and the control unit 720 transmit and receive control signals to and from each other via a communication network in accordance with, for example, the Controller Area Network (CAN) protocol.

The integrated circuit 703 has a function of transmitting a control signal or a set value to each photoelectric conversion apparatus 702 in response to a control signal from the main controller 713 or under control of its control unit. The integrated circuit 703 transmits, for example, setting data for signal driving of a voltage switch in the photoelectric conversion apparatus 702 or setting data to switch the voltage switch for each frame.

The photoelectric conversion system 701 is connected to the vehicle sensor 710 and can detect travel states of a vehicle 700, such as a vehicle speed, a yaw rate, and a steering angle, an environment around the vehicle, and a state of another vehicle or an obstruction. The vehicle sensor 710 also functions as a distance information obtaining unit to obtain distance information on a distance from a parallax image to a target object. The photoelectric conversion system 701 is connected to a driving assistance control unit 711, which performs various driving assistances, such as automatic steering, automatic cruise control, and anti-collision control. The driving assistance control unit 711 includes a collision determination unit to estimate a collision with another vehicle or an obstruction on the basis of detection results of the photoelectric conversion system 701 and the vehicle sensor 710 and determine, based on the detection results, the presence or absence of such a collision. Thus, collision avoidance control can be performed in response to estimation of a collision, and a safety device can be activated upon collision.

The photoelectric conversion system 701 is also connected to a warning device 712, which warns a driver based on a determination result of the collision determination unit. For example, if the determination result of the collision determination unit indicates that a collision is highly likely to occur, the main controller 713 controls the vehicle 700 to avoid the collision or reduce damage to the vehicle by, for example, applying brakes, releasing an accelerator pedal, or reducing engine power. The warning device 712 warns a user by, for example, generating an audible alarm, displaying alarm information on a display screen of, for example, a car navigation system or an instrument panel, or vibrating a seatbelt or a steering wheel.

In this embodiment, the photoelectric conversion system 701 captures images of, for example, surroundings ahead of or behind the vehicle 700. FIG. 10B illustrates exemplary arrangement of the components of the photoelectric conversion system 701, which captures images of surroundings ahead of the vehicle 700.

Although control for avoiding a collision with another vehicle has been described in this embodiment, the photoelectric conversion system 701 can be used for automatic driving control that causes a vehicle to automatically follow another vehicle, automatic driving control that causes a vehicle to automatically travel within a lane, or any other control. Furthermore, the photoelectric conversion system 701 can be used not only for a vehicle but also for a ship, an aircraft, and a movable object (movable device), such as an industrial robot. In addition, the photoelectric conversion system 701 can be used not only for a movable object but also for a device that uses broad object recognition, such as Intelligent Transport Systems (ITS).

Other Embodiments

While the embodiments have been described above, the present disclosure is not limited to these embodiments, and variations and modifications may be made. The embodiments can be used in combination with each other.

The present disclosure provides a concrete layout of wiring patterns for reference potential supply in a pixel region and a peripheral region in a photoelectric conversion apparatus including a stack of semiconductor element layers.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2021-059052 filed Mar. 31, 2021, which is hereby incorporated by reference herein in its entirety.

What is claimed is:

1. A photoelectric conversion apparatus comprising:
a first chip including a first semiconductor element layer and a first wiring structure, the first semiconductor element layer having a pixel region having an array of pixel circuits and a peripheral region located outside the pixel region in plan view, the first wiring structure including a first wiring layer; and
a second chip including a second semiconductor element layer and a second wiring structure, the second semiconductor element layer having an electric circuit,
the first chip and the second chip being stacked,
the first and second chips having a trench that extends through the first semiconductor element layer and that has a pad through which a reference potential is supplied to the pixel circuits,
the first wiring layer including a first wiring pattern to which the reference potential is supplied,
wherein, in plan view, the first wiring pattern located in a region aligned with the pixel region has a higher wiring density than the first wiring pattern located in a region aligned with the peripheral region,
wherein the region aligned with the pixel region is a first region including three or more pixel circuits, and
the region aligned with the peripheral region is a second region having the same area as that of the first region.

2. The photoelectric conversion apparatus according to claim 1,
wherein the pad includes a pad electrode, and
the pad electrode is disposed in the second chip.

3. The photoelectric conversion apparatus according to claim 2, wherein the pad electrode overlaps the first wiring pattern in the region aligned with the peripheral region.

4. The photoelectric conversion apparatus according to claim 1, wherein the first chip and the second chip are joined at metal junctions located between the first and second semiconductor element layers.

5. The photoelectric conversion apparatus according to claim 4, wherein the first wiring layer is next to a wiring layer including a wiring pattern forming the metal junctions.

6. The photoelectric conversion apparatus according to claim 1, wherein the first wiring layer includes a pad electrode included in the pad in the first wiring structure.

7. The photoelectric conversion apparatus according to claim 1, wherein the reference potential supplied to the first wiring pattern is a power supply voltage or a ground voltage.

8. The photoelectric conversion apparatus according to claim 7, wherein the reference potential supplied to the first wiring pattern is the power supply voltage.

9. The photoelectric conversion apparatus according to claim 8, wherein the first wiring layer includes a second wiring pattern located in the region aligned with the peripheral region, and the ground voltage is supplied to the second wiring pattern.

10. The photoelectric conversion apparatus according to claim 9, wherein the second wiring pattern is not located in the region aligned with the pixel region.

11. The photoelectric conversion apparatus according to claim 1, wherein the first wiring pattern comprises copper, serving as a main component.

12. The photoelectric conversion apparatus according to claim 4,
  wherein the pixel circuits each include a photoelectric conversion element, and
  the metal junctions each have the photoelectric conversion element.

13. The photoelectric conversion apparatus according to claim 1, wherein the first wiring pattern has a mesh shape in the region aligned with the pixel region.

14. The photoelectric conversion apparatus according to claim 1, wherein the electric circuit is configured to process signals from the pixel circuits.

15. The photoelectric conversion apparatus according to claim 12,
  wherein the first wiring layer is next to a wiring layer including a wiring pattern forming the metal junctions,
  the first wiring pattern includes a portion located in a region aligned with one of the metal junctions, and
  in plan view, the first wiring pattern located in the region aligned with the one of the metal junctions has a higher wiring density than the first wiring pattern located in a region aligned with the peripheral region.

\* \* \* \* \*